United States Patent
Hong et al.

(10) Patent No.: US 7,572,699 B2
(45) Date of Patent: Aug. 11, 2009

(54) PROCESS OF FORMING AN ELECTRONIC DEVICE INCLUDING FINS AND DISCONTINUOUS STORAGE ELEMENTS

(75) Inventors: Cheong Min Hong, Austin, TX (US); Chi-Nan Li, Austin, TX (US)

(73) Assignee: Freescale Semiconductor, Inc, Austin, TX (US)

( * ) Notice: Subject to any disclaimer, the term of this patent is extended or adjusted under 35 U.S.C. 154(b) by 211 days.

(21) Appl. No.: 11/626,762

(22) Filed: Jan. 24, 2007

(65) Prior Publication Data

US 2008/0173922 A1      Jul. 24, 2008

(51) Int. Cl.
*H01L 21/336*  (2006.01)
(52) U.S. Cl. .................. 438/257; 438/156; 438/243; 438/245; 438/258; 438/259; 438/261; 438/287; 257/E21.679
(58) Field of Classification Search ................ 438/156, 438/245
See application file for complete search history.

(56) References Cited

U.S. PATENT DOCUMENTS

| | | | |
|---|---|---|---|
| 4,184,207 A | 1/1980 | McElroy et al. |
| 4,751,558 A | 6/1988 | Kenney |
| 4,785,337 A | 11/1988 | Kenney |
| 4,833,094 A | 5/1989 | Kenney |
| 4,860,070 A | 8/1989 | Arimoto et al. |
| 5,196,722 A | 3/1993 | Bergendahl et al. |
| 5,252,845 A | 10/1993 | Kim et al. |
| 5,315,142 A | 5/1994 | Acovic et al. |
| 5,411,905 A | 5/1995 | Acovic et al. |
| 5,432,365 A | 7/1995 | Chin et al. |
| 5,460,988 A | 10/1995 | Hong |
| 5,567,635 A | 10/1996 | Acovic et al. |
| 5,705,415 A | 1/1998 | Orlowski et al. |
| 5,721,448 A | 2/1998 | Hauf et al. |
| 5,786,612 A | 7/1998 | Otani et al. |
| 5,801,415 A | 9/1998 | Lee et al. |
| 5,824,580 A | 10/1998 | Hauf et al. |
| 5,907,775 A | 5/1999 | Tseng |
| 5,914,523 A | 6/1999 | Bashir et al. |
| 5,923,046 A | 7/1999 | Tezuka et al. |
| 5,969,383 A | 10/1999 | Chang et al. |
| 5,998,263 A | 12/1999 | Sekariapuram et al. |
| 6,060,743 A | 5/2000 | Sugiyama |

(Continued)

OTHER PUBLICATIONS

U.S. Appl. No. 10/961,295, filed Oct. 8, 2004.

(Continued)

*Primary Examiner*—N Drew Richards
*Assistant Examiner*—Kyoung Lee

(57) ABSTRACT

An electronic device can include a substrate including a fin lying between a first trench and a second trench, wherein the fin is no more than approximately 90 nm wide. The electronic device can also include a first gate electrode within the first trench and adjacent to the fin, and a second gate electrode within the second trench and adjacent to the fin. The electronic device can further include discontinuous storage elements including a first set of discontinuous storage elements and a second set of discontinuous storage elements, wherein the first set of the discontinuous storage elements lies between the first gate electrode and the fin, and the second set of the discontinuous storage elements lies between the second gate electrode and the fin. Processes of forming and using the electronic device are also described.

20 Claims, 9 Drawing Sheets

U.S. PATENT DOCUMENTS

| | | | |
|---|---|---|---|
| 6,074,954 A | 6/2000 | Lill et al. | |
| 6,117,733 A | 9/2000 | Sung et al. | |
| 6,121,148 A | 9/2000 | Bashir et al. | |
| 6,133,601 A | 10/2000 | Watanabe | |
| 6,172,905 B1 | 1/2001 | White et al. | |
| 6,228,706 B1 | 5/2001 | Horak et al. | |
| 6,232,632 B1 | 5/2001 | Liu | |
| 6,265,268 B1 | 7/2001 | Halliyal et al. | |
| 6,281,064 B1 | 8/2001 | Mandelman et al. | |
| 6,287,917 B1 | 9/2001 | Park et al. | |
| 6,307,782 B1 | 10/2001 | Sadd et al. | |
| 6,320,784 B1 | 11/2001 | Muralidhar et al. | |
| 6,330,184 B1 | 12/2001 | White et al. | |
| 6,344,403 B1 | 2/2002 | Madhukar et al. | |
| 6,365,452 B1 | 4/2002 | Perng et al. | |
| 6,368,916 B1 | 4/2002 | Nakagawa | |
| 6,372,617 B1 | 4/2002 | Kitamura | |
| 6,373,096 B1 | 4/2002 | Hisamune et al. | |
| 6,399,441 B1 | 6/2002 | Ogura et al. | |
| 6,461,905 B1 | 10/2002 | Wang et al. | |
| 6,486,028 B1 | 11/2002 | Chang et al. | |
| 6,537,870 B1 | 3/2003 | Shen | |
| 6,544,827 B2 | 4/2003 | Abiko | |
| 6,555,427 B1 | 4/2003 | Shimizu et al. | |
| 6,559,032 B2 | 5/2003 | Gonzalez et al. | |
| 6,583,466 B2 | 6/2003 | Lin et al. | |
| 6,620,664 B2 | 9/2003 | Ma et al. | |
| 6,638,810 B2 | 10/2003 | Bakli et al. | |
| 6,673,681 B2 | 1/2004 | Kocon et al. | |
| 6,674,120 B2 | 1/2004 | Fujiwara | |
| 6,677,204 B2 | 1/2004 | Cleeves et al. | |
| 6,687,156 B2 | 2/2004 | Kobayashi et al. | |
| 6,706,599 B1 | 3/2004 | Sadd et al. | |
| 6,709,922 B2 | 3/2004 | Ebina et al. | |
| 6,713,834 B2 | 3/2004 | Mori et al. | |
| 6,747,308 B2 | 6/2004 | Mitros et al. | |
| 6,750,499 B2 | 6/2004 | Wu | |
| 6,762,092 B2 | 7/2004 | Yuan et al. | |
| 6,803,620 B2 | 10/2004 | Moriya et al. | |
| 6,816,414 B1 | 11/2004 | Prinz | |
| 6,818,508 B2 | 11/2004 | Shimizu et al. | |
| 6,818,512 B1 | 11/2004 | Hsieh et al. | |
| 6,818,939 B1 | 11/2004 | Hadizad | |
| 6,853,587 B2 | 2/2005 | Forbes | |
| 6,861,315 B1 | 3/2005 | Chen et al. | |
| 6,864,540 B1 | 3/2005 | Divakaruni et al. | |
| 6,881,994 B2 | 4/2005 | Lee et al. | |
| 6,894,339 B2 | 5/2005 | Fan et al. | |
| 6,903,418 B2 | 6/2005 | Iwamoto et al. | |
| 6,916,715 B2 | 7/2005 | Hsiao et al. | |
| 6,936,887 B2 | 8/2005 | Harari et al. | |
| 6,952,034 B2 | 10/2005 | Hu et al. | |
| 6,958,513 B2 | 10/2005 | Wang et al. | |
| 6,991,984 B2 | 1/2006 | Ingersoll et al. | |
| 7,015,537 B2 | 3/2006 | Lee et al. | |
| 7,037,787 B2 | 5/2006 | Fan et al. | |
| 7,045,423 B2 | 5/2006 | Ichige et al. | |
| 7,078,286 B1 | 7/2006 | Mehta | |
| 7,098,502 B2 | 8/2006 | Mathew et al. | |
| 7,112,490 B1 | 9/2006 | Hong et al. | |
| 7,122,432 B2 | 10/2006 | Shimizu et al. | |
| 7,126,188 B2 | 10/2006 | Shone | |
| 7,192,830 B2 | 3/2007 | Goldbach et al. | |
| 7,199,419 B2 | 4/2007 | Haller | |
| 7,220,634 B2 | 5/2007 | Prall et al. | |
| 7,259,984 B2 | 8/2007 | Kan et al. | |
| 7,279,740 B2 | 10/2007 | Bhattacharyya et al. | |
| 7,371,642 B2 | 5/2008 | Forbes | |
| 2003/0062565 A1 | 4/2003 | Yamazaki et al. | |
| 2003/0068864 A1 | 4/2003 | Il-Yong et al. | |
| 2003/0071302 A1* | 4/2003 | Hirotomo et al. | 257/314 |
| 2004/0121540 A1 | 6/2004 | Lin | |
| 2005/0146938 A1 | 7/2005 | Forbes | |
| 2005/0148173 A1 | 7/2005 | Shone | |
| 2005/0242391 A1 | 11/2005 | She et al. | |
| 2005/0259475 A1 | 11/2005 | Forbes | |
| 2005/0280089 A1 | 12/2005 | Forbes | |
| 2005/0280094 A1 | 12/2005 | Forbes | |
| 2006/0011966 A1 | 1/2006 | Wang | |
| 2006/0046383 A1 | 3/2006 | Chen et al. | |
| 2006/0131640 A1 | 6/2006 | Yu et al. | |
| 2006/0152978 A1 | 7/2006 | Forbes | |
| 2006/0166443 A1 | 7/2006 | Forbes | |
| 2007/0238249 A1 | 10/2007 | Swift et al. | |

OTHER PUBLICATIONS

U.S. Appl. No. 11/079,674, filed Mar. 14, 2005.
U.S. Appl. No. 11/188,582, filed Jul. 25, 2005.
U.S. Appl. No. 11/188,583, filed Jul. 25, 2005.
U.S. Appl. No. 11/188,584, filed Jul. 25, 2005.
U.S. Appl. No. 11/188,585, filed Jul. 25, 2005.
U.S. Appl. No. 11/188,588, filed Jul. 25, 2005.
U.S. Appl. No. 11/188,591, filed Jul. 25, 2005.
U.S. Appl. No. 11/188,603, filed Jul. 25, 2005.
U.S. Appl. No. 11/525,747, filed Sep. 22, 2006.
U.S. Appl. No. 11/188,615, filed Jul. 25, 2005.
U.S. Appl. No. 11/188,898, filed Jul. 25, 2005.
U.S. Appl. No. 11/188,909, filed Jul. 25, 2005.
U.S. Appl. No. 11/188,910, filed Jul. 25, 2005.
U.S. Appl. No. 11/188,935, filed Jul. 25, 2005.
U.S. Appl. No. 11/188,939, filed Jul. 25, 2005.
U.S. Appl. No. 11/188,953, filed Jul. 25, 2005.
U.S. Appl. No. 11/188,999, filed Jul. 25, 2005.
Van Houdt, J., et al. "An Analytical Model for the Optimization of Source-Side Injection Flash EEPROM Devices," IEEE Transactions on Electron Devices, vol. 42, No. 7, pp. 1314-1320, Jul. 1995.
Guan, H., et al. "An Analytical Model for Opitimization of Programming Efficiency and Uniformity of Split Gate Source-Side Injection Superflash Memory," IEEE Transactions on Electron Devices, vol. 50, No. 3, pp. 809-815, Mar. 2003.
Hayashi, Y., et al. "Twin MONOS Cell with Dual Control Gates," 2000 Symposium on VLSI Technology Digest of Technical Papers, pp. 122-123, 2000.
Lee, D., et al. "Vertical Floating-Gate 4.5F2 Split-Gate NOR Flash Memory at 110nm Node," 2004 Symposium on VLSI Technology Digest of Technical Papers, pp. 72-73, 2004.
Ma, Y. et al. "A Dual-Bit Split Gate EEPROM (DSG) Cell in Contactless Array for Single-Vcc High Density Flash Memories," IEDM, p. 57-60, 1994.
Osabe, T. et al. "Charge-Injection Length in Silicon Nanocrystal Memory Cells," 2004 Symposium on VLSI Technology Digest of Technical Papers p. 242-243, 2004.
Actions on the Merits by U.S.P.T.O, as of Mar. 20, 2008, 12 pgs.
Yang, Edward S., "8-3 Channel Conductance", Fundamentals of Semiconductor Devices, McGraw-Hill Book Company, p. 205, 1978.
Actions on the Merits by U.S.P.T.O, as of Jul. 25, 2008, 13 pgs.
U.S. Appl. No. 11/834,391, filed Aug. 6, 2007.
U.S. Appl. No. 11/626,753, filed Jan. 24, 2007.
U.S. Appl. No. 11/626,768, filed Jan. 24, 2007.
Actions on the Merits by U.S.P.T.O, as of Aug. 8, 2007, 9 pgs.
Actions on the Merits by U.S.P.T.O, as of Oct. 24, 2008, 14 pgs.
Actions on the Merits by U.S P T O, as of Feb. 17, 2009, 14 pgs.

* cited by examiner

| | GL1 1541 | GL2 1542 | GL3 1543 | GL4 1544 | GL5 1545 | GL6 1546 | BL1 1561 | BL2 1562 | BL3 1563 | BL4 1564 |
|---|---|---|---|---|---|---|---|---|---|---|
| PGM 15111 | 8 | 8 | 0 | 0 | 0 | 0 | 5 | 0 | FLOAT | FLOAT |
| READ 15111 | 3 | 6 | 0 | 0 | 0 | 0 | 1 | 0 | FLOAT | FLOAT |
| PGM 15112 | 8 | 6 | 0 | 0 | 0 | 0 | 5 | 0 | FLOAT | FLOAT |
| READ 15112 | 3 | 6 | 0 | 0 | 0 | 0 | 2 | 1 | FLOAT | FLOAT |
| PGM 15113 | 6 | 8 | 0 | 0 | 0 | 0 | 0 | 5 | FLOAT | FLOAT |
| READ 15113 | 6 | 3 | 0 | 0 | 0 | 0 | 1 | 2 | FLOAT | FLOAT |
| PGM 15114 | 8 | 8 | 0 | 0 | 0 | 0 | 0 | 5 | FLOAT | FLOAT |
| READ 15114 | 6 | 3 | 0 | 0 | 0 | 0 | 0 | 1 | FLOAT | FLOAT |
| PGM 15121 | 0 | 0 | 8 | 8 | 0 | 0 | 5 | 0 | FLOAT | FLOAT |
| READ 15121 | 0 | 0 | 3 | 6 | 0 | 0 | 1 | 0 | FLOAT | FLOAT |
| PGM 15122 | 0 | 0 | 8 | 6 | 0 | 0 | 5 | 0 | FLOAT | FLOAT |
| READ 15122 | 0 | 0 | 3 | 6 | 0 | 0 | 2 | 1 | FLOAT | FLOAT |
| PGM 15123 | 0 | 0 | 6 | 8 | 0 | 0 | 0 | 5 | FLOAT | FLOAT |
| READ 15123 | 0 | 0 | 6 | 3 | 0 | 0 | 1 | 2 | FLOAT | FLOAT |
| PGM 15124 | 0 | 0 | 8 | 8 | 0 | 0 | 0 | 5 | FLOAT | FLOAT |
| READ 15124 | 0 | 0 | 6 | 3 | 0 | 0 | 0 | 1 | FLOAT | FLOAT |
| PGM 15131 | 0 | 0 | 0 | 0 | 8 | 8 | 5 | 0 | FLOAT | FLOAT |
| READ 15131 | 0 | 0 | 0 | 0 | 3 | 6 | 1 | 0 | FLOAT | FLOAT |
| PGM 15132 | 0 | 0 | 0 | 0 | 8 | 6 | 5 | 0 | FLOAT | FLOAT |
| READ 15132 | 0 | 0 | 0 | 0 | 3 | 6 | 2 | 1 | FLOAT | FLOAT |
| PGM 15133 | 0 | 0 | 0 | 0 | 6 | 8 | 0 | 5 | FLOAT | FLOAT |
| READ 15133 | 0 | 0 | 0 | 0 | 6 | 3 | 1 | 2 | FLOAT | FLOAT |
| PGM 15134 | 0 | 0 | 0 | 0 | 8 | 8 | 0 | 5 | FLOAT | FLOAT |
| READ 15134 | 0 | 0 | 0 | 0 | 6 | 3 | 0 | 1 | FLOAT | FLOAT |
| PGM 15211 | 8 | 8 | 0 | 0 | 0 | 0 | FLOAT | FLOAT | 5 | 0 |
| READ 15211 | 3 | 6 | 0 | 0 | 0 | 0 | FLOAT | FLOAT | 1 | 0 |
| PGM 15212 | 8 | 6 | 0 | 0 | 0 | 0 | FLOAT | FLOAT | 5 | 0 |
| READ 15212 | 3 | 6 | 0 | 0 | 0 | 0 | FLOAT | FLOAT | 2 | 1 |
| PGM 15213 | 6 | 8 | 0 | 0 | 0 | 0 | FLOAT | FLOAT | 0 | 5 |
| READ 15213 | 6 | 3 | 0 | 0 | 0 | 0 | FLOAT | FLOAT | 1 | 2 |
| PGM 15214 | 8 | 8 | 0 | 0 | 0 | 0 | FLOAT | FLOAT | 0 | 5 |
| READ 15214 | 6 | 3 | 0 | 0 | 0 | 0 | FLOAT | FLOAT | 0 | 1 |
| PGM 15221 | 0 | 0 | 8 | 8 | 0 | 0 | FLOAT | FLOAT | 5 | 0 |
| READ 15221 | 0 | 0 | 3 | 6 | 0 | 0 | FLOAT | FLOAT | 1 | 0 |
| PGM 15222 | 0 | 0 | 8 | 6 | 0 | 0 | FLOAT | FLOAT | 5 | 0 |
| READ 15222 | 0 | 0 | 3 | 6 | 0 | 0 | FLOAT | FLOAT | 2 | 1 |
| PGM 15223 | 0 | 0 | 6 | 8 | 0 | 0 | FLOAT | FLOAT | 0 | 5 |
| READ 15223 | 0 | 0 | 6 | 3 | 0 | 0 | FLOAT | FLOAT | 1 | 2 |
| PGM 15224 | 0 | 0 | 8 | 8 | 0 | 0 | FLOAT | FLOAT | 0 | 5 |
| READ 15224 | 0 | 0 | 6 | 3 | 0 | 0 | FLOAT | FLOAT | 0 | 1 |
| PGM 15231 | 0 | 0 | 0 | 0 | 8 | 8 | FLOAT | FLOAT | 5 | 0 |
| READ 15231 | 0 | 0 | 0 | 0 | 3 | 6 | FLOAT | FLOAT | 1 | 0 |
| PGM 15232 | 0 | 0 | 0 | 0 | 8 | 6 | FLOAT | FLOAT | 5 | 0 |
| READ 15232 | 0 | 0 | 0 | 0 | 3 | 6 | FLOAT | FLOAT | 2 | 1 |
| PGM 15233 | 0 | 0 | 0 | 0 | 6 | 8 | FLOAT | FLOAT | 0 | 5 |
| READ 15233 | 0 | 0 | 0 | 0 | 6 | 3 | FLOAT | FLOAT | 1 | 2 |
| PGM 15234 | 0 | 0 | 0 | 0 | 8 | 8 | FLOAT | FLOAT | 0 | 5 |
| READ 15234 | 0 | 0 | 0 | 0 | 6 | 3 | FLOAT | FLOAT | 0 | 1 |

PROCESS OF FORMING AN ELECTRONIC DEVICE INCLUDING FINS AND DISCONTINUOUS STORAGE ELEMENTS

CROSS-REFERENCE TO RELATED APPLICATIONS

This application is related to U.S. patent application Ser. No. 11/626,753 entitled "Electronic Device Including Trenches and Discontinuous Storage Elements and Processes of Forming and Using the Same" by Li et at. filed on Jan. 24, 2007, and Ser. No. 11/626,768 entitled "Electronic Device Including Trenches and Discontinuous Storage Elements and Processes of Forming and Using the Same" by Li et al. filed on Jan. 24, 2007, both of which are assigned to the current assignee hereof.

BACKGROUND

1. Field of the Disclosure

The present invention relates to electronic devices and processes, and more particularly, to electronic devices including fins and discontinuous storage elements and processes of forming and using the electronic devices.

2. Description of the Related Art

Floating gate nonvolatile memories ("FG NVM") are conventional and are commonly used in many applications. The three most common types of programming mechanisms for FG NVM include Fowler-Nordheim tunneling, conventional hot carrier injection, and source-side injection. Fowler-Nordheim tunneling is efficient but is very slow. Efficiency can be measured by dividing the number of carriers that enter a floating gate or one or more other storage elements divided by the number of carriers that enter a memory cell having the floating gate or the other storage element(s). The latter number can be approximated by using the product of the programming current and the programming time.

Hot carrier injection can include conventional hot carrier injection and source-side injection. Both involve the generation of hot carriers, some of which are injected into the floating or the other storage element(s). In conventional hot carrier injection when using a floating gate, an electrical field is generated along a channel region of a memory cell. Within the channel region, the electrical field is the highest near the drain region. The electrical field accelerates carriers flowing within the channel region, such that, within the channel region, the carriers are traveling the fastest near the drain region. A small fraction of carriers collide with silicon or one or more other atoms within the channel region, redirecting the energetic carriers to the floating gate or other charge storage element(s). An electrical field generated by a control gate electrode can help inject some of that small fraction of the hot carriers into the floating gate. Conventional hot carrier injection is inefficient and has high programming current.

Source-side injection is a popular compromise, with respect to efficiency and programming current, between Fowler-Nordheim tunneling and conventional hot carrier injection. With source-side injection, hot carriers are still generated, however, most of the hot carriers are generated within a portion of the channel region that is spaced apart from the drain region. Memory cells designed to be programmed by source-side injection are not without problems. Typically, the memory cells require one or more additional critical lithographic sequences and result in larger memory cells.

High density floating gate memories are becoming more difficult to fabricate in commercial volumes. As the thickness of the gate dielectric layer decreases, the likelihood of a pinhole or other defect extending through the thickness of the gate dielectric layer increases. Such a defect can cause an electrical short or leakage path between the substrate and the floating gate. The electrical short or leakage path can affect the voltage on the floating gate, and therefore, the memory cell may not be able to retain data. One or more materials may be used for the gate dielectric layer instead of silicon dioxide, however, such material(s) may have other issues, such as material compatibility with other materials used in the memory cell, require new equipment, increase manufacturing costs, etc.

BRIEF DESCRIPTION OF THE DRAWINGS

The invention is illustrated by way of example and not limitation in the accompanying figures.

FIGS. 15 through 17 include a circuit schematic diagram, a cross-sectional views of an exemplary physical embodiment of the circuit schematic diagram, and an operating voltage table for memory cell within an NVM array.

Figure 1:
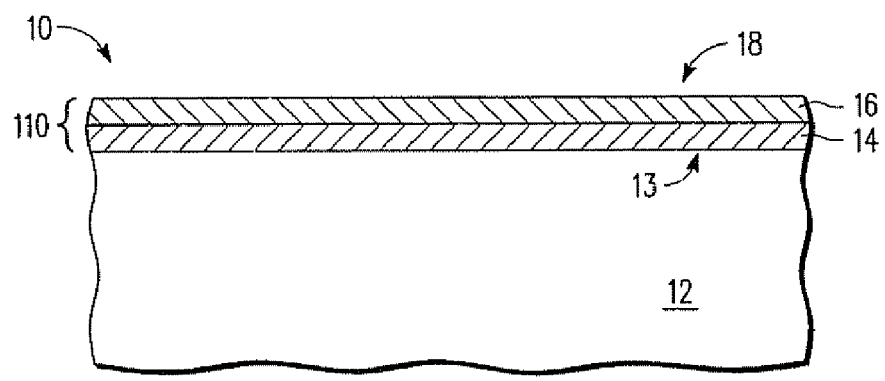
FIG. 1 includes an illustration of a cross-sectional view of a portion of a workpiece after forming a protective layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can include a substrate including a fin lying between a first trench and a second trench, wherein the fin is no more than approximately 90 nm wide. The electronic device can also include a first gate electrode within the first trench and adjacent to the fin, and a second gate electrode within the second trench and adjacent to the fin. The electronic device can further include discontinuous storage elements including a first set of discontinuous storage elements and a second set of discontinuous storage elements, wherein the first set of the discontinuous storage elements lies between the first gate electrode and the fin, and the second set of the discontinuous storage elements lies between the second gate electrode and the fin. Processes of forming and using the electronic device are also described.

The processes and structures described below allow memory cells or portions thereof to be formed with gate electrodes and doped regions adjacent to the gate electrodes that have dimensions smaller than the resolution limits of lithographic processes. Thus, a relatively smaller memory cell that can hold up to four bits of data can be formed. Also, within each memory cell, a fin is formed that allows a portion of the substrate under the fin to act as a resistor within the channel region to assist in generating a proper electrical field for source-side injection ("SSI"). Conventional hot carrier injection ("HCI") and SSI can be used to program charge storage regions within the memory cells. Other embodiments allow for an electronic device having a contactless array.

Before addressing details of embodiments described below, some terms are defined or clarified. The term "discontinuous storage elements" is intended to mean spaced-apart objects capable of storing a charge. In one embodiment, substantially all discontinuous storage elements may be initially formed and remain separate from one another. In another embodiment, a substantially continuous layer of material formed an later separated into discontinuous storage elements. In yet another embodiment, substantially all discontinuous storage elements may be initially formed separate from one another, and later during the formation, some but not all of the discontinuous storage elements may coalesce.

The term "oriented" is intended to mean a principal direction in which a feature extends (e.g., from a top view, the longer of two dimensions of the feature, such as the length). As between different features at the same elevation or at different elevations, the features may be oriented substantially parallel, substantially perpendicular, or another angular relationship with respect to each other.

The term "stack" is intended to mean a plurality of layers or a plurality of at least one layer and at least one structure (e.g., nanocrystals), wherein the plurality of layers or plurality of layer(s) and structure(s) provides an electronic function. For example, a nonvolatile memory stack can include layers used to form at least part of a nonvolatile memory cell. A stack may be part of a larger stack. For example, a nonvolatile memory stack can include a charge storage stack that is used to store charge within a nonvolatile memory cell.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. To the extent not described herein, many details regarding specific materials, processing acts, and circuits are conventional and may be found in textbooks and other sources within the semiconductor and microelectronic arts.

FIG. 1 includes a cross-sectional view of a portion of an electronic device 10, such as an integrated circuit. The integrated circuit can be a standalone memory, a microcontroller, or other integrated circuit that includes a memory. In one embodiment, the electronic device 10 can include a nonvolatile memory ("NVM") array 18, a portion of which is illustrated in FIG. 1. A substrate 12 can include a monocrystalline semiconductor wafer, a semiconductor-on-insulator wafer, a flat panel display (e.g., a silicon layer over a glass plate), or other substrate conventionally used to form electronic devices. Although not illustrated, shallow trench field isolation may be formed over portions of the substrate 12 in peripheral areas outside of the NVM array 18. The upper most surface of substrate 12 is a primary surface 13. Optionally, the doping concentration of the substrate 12 along the primary surface 13 within the NVM array 18 can be increased using a conventional or proprietary doping operation to potentially reduce leakage current between subsequently-formed gate electrodes that may overlie portions of the primary surface 13. A protective layer 110 can be formed over the primary surface 13 of the substrate 12. The protective layer 110 can include a pad layer 14 and an oxidation-resistant layer 16 over the pad layer 14. The protective layer 110 could have more or fewer layers than are illustrated. The protective layer 110 can remain over the peripheral areas until fabrication of the NVM array 18 is substantially completed. In one embodiment, the pad layer 14 includes oxide, and the oxidation-resistant layer 16 includes nitride.

Figure 2:
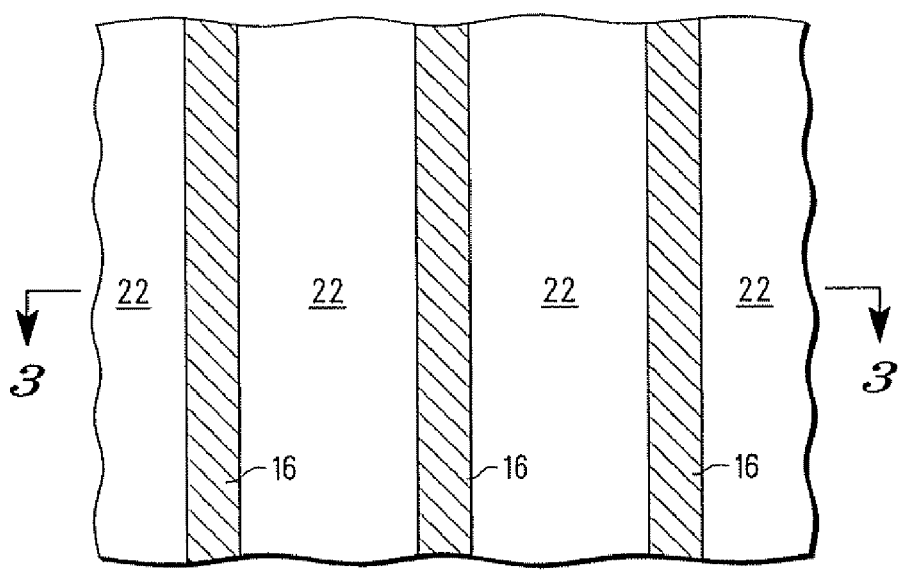
FIGS. 2 and 3 include illustrations of a top view and a cross-sectional view, respectively, of the workpiece of FIG. 1 after forming trenches.
Figure 3:
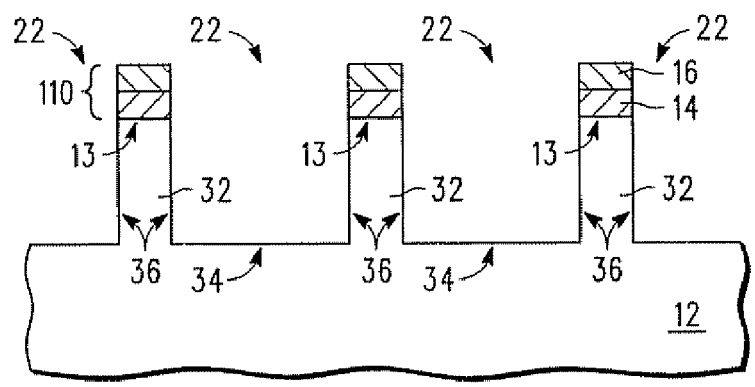

FIGS. 2 and 3 include illustrations of a top view and a cross-sectional view, respectively, of the memory array after etching trenches 22 to define fins 32. A patterned resist layer (not illustrated), which includes openings at locations within the NVM array 18 where trenches are to be formed, is formed over the substrate 12 by a conventional or proprietary technique. Exposed portions of the protective layer 110 can then be removed by a conventional or proprietary technique to expose the primary surface 13. In one embodiment, the trenches 22 are formed prior to removal of the patterned resist layer. The patterned resist layer can then be removed, and the trenches 22 can then be formed by a conventional or proprietary technique. The trenches 22 extend from primary surface 13 and include bottoms 34 and walls 36. Referring to FIG. 2, the trenches 22 are oriented substantially parallel to one another. In one embodiment, the depths of trenches 22 are in a range of approximately 50 to approximately 500 nm. In one particular embodiment, the trenches 22 are formed using a timed anisotropic etch to produce the walls 36 that are substantially vertical. In one embodiment, the trenches 22 have substantially uniform depths.

The trenches 22 are spaced apart from one another by the fins 32, which include remaining portions of the substrate 12 between the trenches 22. In one embodiment, when programming or reading a memory cell (as described later in this specification), a principle current flow is below the fin 32. While some current may enter or leave the fin 32, substantially no current flows along or through the top of the fin 32 (adjacent to the primary surface 13), during normal operation of the memory cell. In one embodiment, each of fins 32 has a width no greater than approximately 90 nm, and in another embodiment, no greater than approximately 50 nm. In still another embodiment, the width is at least approximately 11 nm. In a particular embodiment, the width is in a range of approximately 20 to approximately 40 nm. After reading this specification, skilled artisans will appreciate that the trenches 22 can be shallower or deeper, the fins 32 can be wider or narrower fins 32, or any combination thereof in other embodiments. Remaining portions of the protective layer 110 can be removed using a conventional or proprietary technique.

Figure 4:
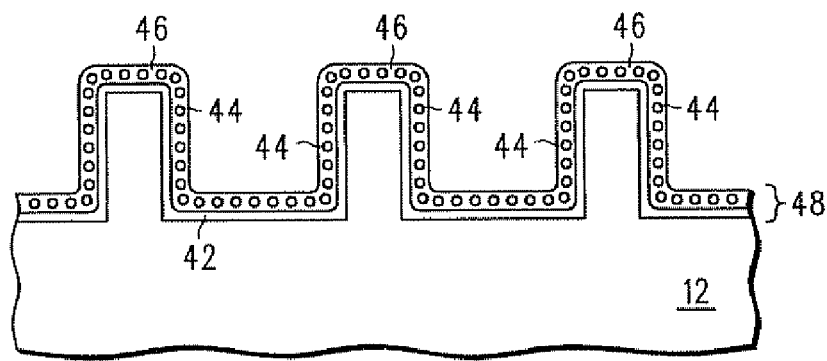
FIG. 4 includes an illustration of a cross-sectional view of a workpiece of FIGS. 2 and 3 after forming a charge storage stack including discontinuous storage elements.

A charge storage stack 48, including a dielectric layer 42, discontinuous storage elements 44, and another dielectric layer 46, can then be formed, as illustrated in FIG. 4. The dielectric layer 42 may be thermally grown using an oxidizing or nitridizing ambient, or deposited using a conventional or proprietary chemical vapor deposition technique, physical vapor deposition technique, atomic layer deposition technique, or a combination thereof. If the dielectric layer 42 is thermally grown, it is not formed outside the trenches in the NVM array 18. If the dielectric layer 42 is deposited, it can be deposited over substantially all of the exposed surfaces of the workpiece. The dielectric layer 42 can include one or more films of silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_b$-$O_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. The dielectric layer 42 has a thickness in a range of approximately 1 to approximately 10 nm. The thickness and material selection of the dielectric layer 42 will substantially determine its electrical properties. In one embodiment the thickness and material are chosen such that the dielectric layer 42 has a silicon dioxide equivalent thickness of less than 10 nm.

The discontinuous storage elements 44 are then formed over NVM array 18. In one embodiment, discontinuous storage elements 44 overlie the fins 32 (including the primary surface 13 of the substrate 12) and lie within trenches 22. The individual discontinuous storage elements 44 are substantially physically separated from each other. The discontinuous storage elements 44 can include a material capable of storing a charge, such as silicon, a nitride, a metal-containing material, another suitable material capable of storing charge, or any combination thereof. For example, the discontinuous storage elements 44 can include silicon nanocrystals or metal nanoclusters. In one particular embodiment, a substantially continuous layer of amorphous silicon can be formed over exposed surfaces of the substrate 12. The substantially continuous layer can be exposed to heat or other processing conditions that can cause the layer to "ball up" or otherwise form silicon nanocrystals. The discontinuous storage elements 44 may be undoped, doped during deposition, or doped after deposition. In one embodiment, the discontinuous storage elements 44 can be formed from one or more materials whose properties are not significantly adversely affected during a thermal oxidation process. Such a material can include platinum, palladium, iridium, osmium, ruthenium, rhenium, indium-tin, indium-zinc, aluminum-tin, or any combination thereof. Each of such materials, other than platinum and palladium, may form a conductive metal oxide. In one embodiment, each of the discontinuous storage elements 44 is no greater than approximately 10 nm in any dimension. In another embodiment, the discontinuous storage elements 44 can be larger, however, the discontinuous storage elements 44 are not formed so large as to form a continuous structure (i.e., all of the discontinuous storage elements 44 are not fused together).

The dielectric layer 46 is then formed over the discontinuous storage elements 44. The dielectric layer 46 can include one or more dielectric films, any of which may be thermally grown or deposited. The dielectric layer 46 can include any one or more materials or be formed using any of the embodiments as described with respect to the dielectric 42 layer. The dielectric layer 46 can have the same or different composition compared to the dielectric 42 layer and may be formed using the same or different formation technique compared to the dielectric layer 42.

Figure 5:
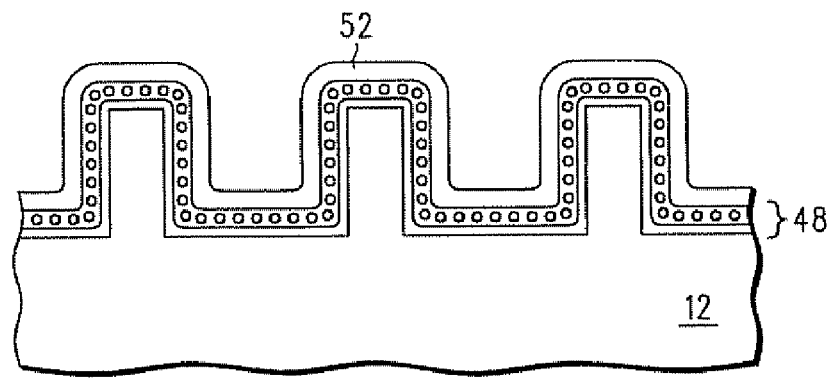
FIG. 5 includes an illustration of a cross-sectional view of a workpiece of FIG. 4 after forming a layer of a gate electrode material.

A gate electrode material 52 is then formed overlying the workpiece and only partly fills remaining portions of the trenches 22, as illustrated in FIG. 5. The gate electrode material 52 can include a semiconductor-containing film, a metal-containing film, or any combination thereof. In one embodiment, the gate electrode material 52 includes polysilicon or amorphous silicon. In another embodiment, the gate electrode material 52 may include one or more other materials. In a particular embodiment, the thickness of gate electrode material 52 is not greater than approximately 200 nm, and in another particular embodiment is no greater than 90 nm. In yet another embodiment, the thickness of gate electrode material 52 is at least approximately 20 nm, and in another particular embodiment is at least 50 nm. In a finished device, the gate electrode material 52 can have a dopant concentration of at least $1E19$ atoms/cm$^3$ when gate electrode material 52 includes polysilicon or amorphous silicon.

The gate electrode material 52 can be deposited by chemical vapor deposition, physical vapor deposition, or a combination thereof. In an embodiment, the gate electrode material 52 can be deposited substantially conformally. In another embodiment, the gate electrode material 52 may not be completely conformal; however, a significant portion of the gate electrode material 52 still forms along the charge storage stack 48 near the walls 36 of the trenches 22. In one particular embodiment, the gate electrode material 52 is doped when deposited, and in another particular embodiment, is doped after it is deposited.

Figure 6:
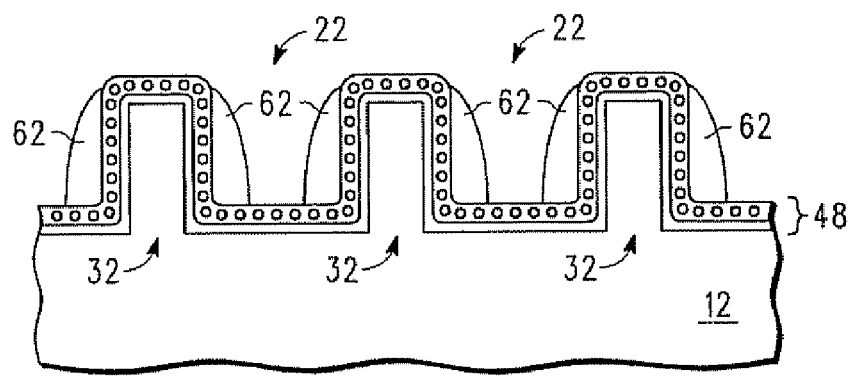
FIG. 6 includes an illustration of a cross-sectional view of a workpiece of FIG. 5 after forming gate electrodes.

FIG. 6 includes an illustration of a cross-sectional view after the gate electrode material 52 has been etched to form gate electrodes 62. In one embodiment, an anisotropic etch is performed to remove portions of gate electrode material 52 overlying the fins 32 and portions of the bottoms of the trenches 22. In one embodiment, the gate electrodes 62 are in the form of sidewall spacers and have an arc-shaped outer surface, although other shapes can be used in other embodiments. In one embodiment, the bases of the gate electrodes 62 have widths that are approximately the same as the thickness of the gate electrode material, as deposited. In another embodiment, the bases have widths that are at least half of the thickness of the gate electrode material, as deposited. In a particular embodiment, each of the bases of the gate electrodes 62 are in a range of approximately 50 to approximately 90 nm wide. The etching chemistry and other etching parameters can use conventional or proprietary etching chemistries and etching parameters used for etching gate electrode materials. Although not illustrated, a mask and etch process sequence can be used to separate the gate electrodes 62 at the ends of the trenches 22, so that the gate electrodes 62 lying adjacent to opposite sides of the trenches 22 are not electrically shorted to each other. Portions of the charge storage stack 48 overlying the fins 32 and lying between the gate electrodes 62 within the trenches 22 become exposed.

Figure 7:
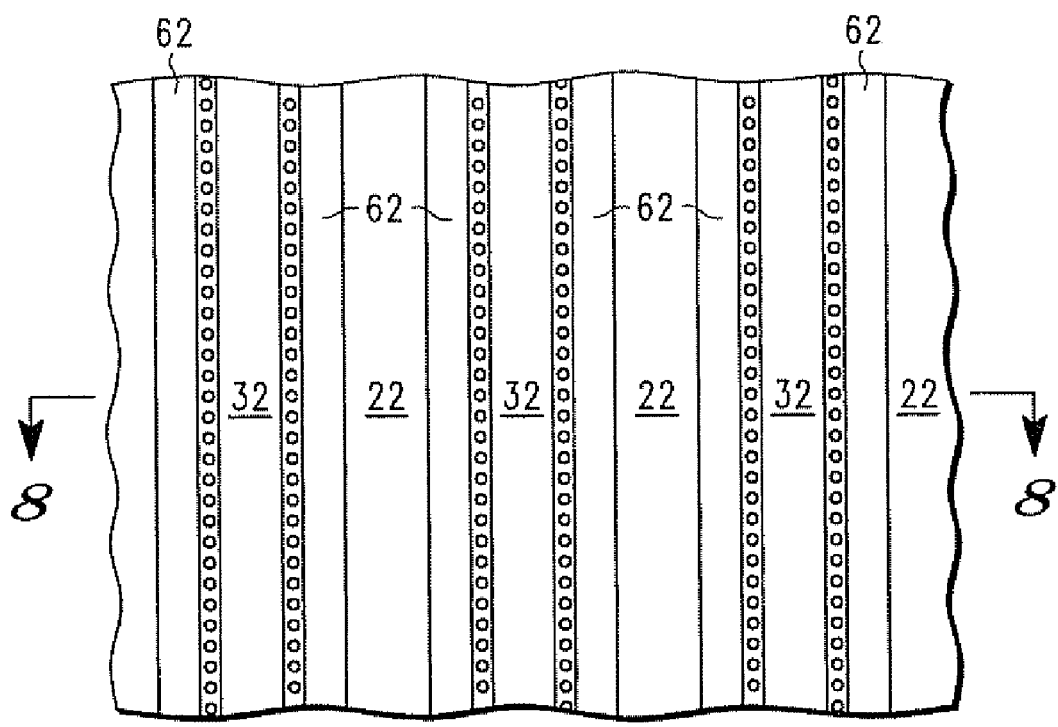
FIGS. 7 and 8 include illustrations of a top view and a cross-sectional view, respectively, of the workpiece of FIG. 6 after removing portions of the charge storage stack and forming insulating layers on exposed surfaces of the substrate and gate electrodes.
Figure 8:
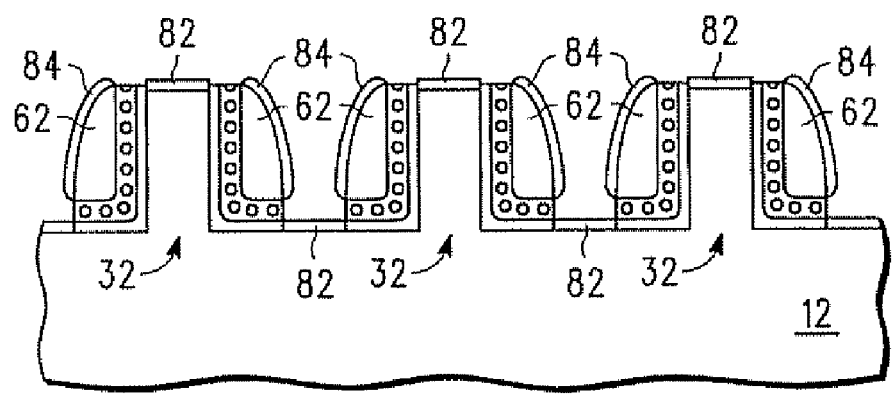

FIGS. 7 and 8 include illustrations of a top view and a cross-sectional view, respectively, after removing portions of the discontinuous storage elements 44 that are not protected by the gate electrodes 62. In FIG. 7 and other top views, some dielectric or insulating layers are not illustrated to simplify understanding of positional relationships between features within NVM array 18. The portions of the discontinuous storage elements 44 can be removed by removing substantially all of the exposed portions of the charge storage stack 48, removing part of the of the exposed portions of the charge storage stack 48, thermally consuming (e.g., oxidizing or nitriding) the portions of the discontinuous storage elements 44, or any combination thereof. As illustrated in the embodiment of FIG. 7, the trenches 22, the fins 32, and the gate electrodes 62 are oriented substantially parallel to one another.

In one embodiment, substantially all of the exposed portions of the charge storage stack 48 are removed. In this embodiment, the dielectric layer 46 and the dielectric layer 42 can be etched. In a particular embodiment, the dielectric layer 42 can be removed by a wet etch that undercuts discontinuous storage elements 44, allowing them to be rinsed away. In another embodiment, exposed portions of dielectric layer 46 are removed, exposing discontinuous storage elements 44, which can then undergo additional processing to convert them from an electrically conducting material to an electrically insulating material. In one particular embodiment, discontinuous storage elements 44 are silicon nanocrystals that are oxidized to form silicon dioxide. In still another embodiment, the discontinuous storage elements 44 are etched, and the dielectric layer 42 remains. After reading this specification, skilled artisans will appreciate that other processes can be used to selectively remove the discontinuous storage elements 44 that are not protected by the gate electrodes 62.

As illustrated in the embodiment of FIG. 8, insulating layers 82 are formed over portions of the substrate 12 within the trenches 22 and over the fins 32, and insulating layers 84 are formed along the exposed surfaces of the gate electrodes 62. The insulating layers 82 and 84 can include an oxide, a nitride, an oxynitride, or any combination thereof. The thickness of the insulating layers 82 acts as an implant screen during a subsequent ion implantation when forming source/drain ("S/D") regions. The insulating layer 84 helps to protect the gate electrodes 62 during subsequent processing. The insulating layers 82 and 84 can have a thickness in a range of approximately 5 to approximately 50 nm. The insulating layers 82 and 84 can have the same composition or different compositions and the same thickness or different thicknesses.

Many different embodiments can be used in forming the insulating layers 82 and 84. In one embodiment, exposed portions of the charge storage stack 48 (in FIG. 6) are removed, and the insulating layers 82 and 84 are formed by thermally oxidizing or nitriding parts of the substrate 12 and the gate electrodes 62. In another embodiment, the discontinuous storage elements 44 within the exposed portions of the charge storage stack 48 can be thermally oxidized or nitrided while the dielectric layer 42, and optionally, the dielectric layer 46 are present. While the discontinuous storage elements 44 are being oxidized or nitrided, the insulating layer 84 is formed along the exposed edges of the gate electrodes 62. In this embodiment, the insulating layer 82 is a composite that includes the dielectric layer 42, additional insulating material generated from the discontinuous storage elements 44, and optionally, the dielectric layer 46, addition insulating material from the substrate 12 or both the dielectric layer 46 and the additional insulating material. In still another embodiment (not illustrated), an insulating layer may be deposited over the substrate 12 and the gate electrodes 62, wherein the insulating layer is formed in place of or in conjunction with the insulating layers 82 and 84. The insulating layer has a composition and thickness as previously described for the insulating layers 82 and 84. Except as expressly recited herein, each of the insulating layers 82 and 84, and the deposited insulating layer is formed using a conventional or proprietary technique.

Figure 9:
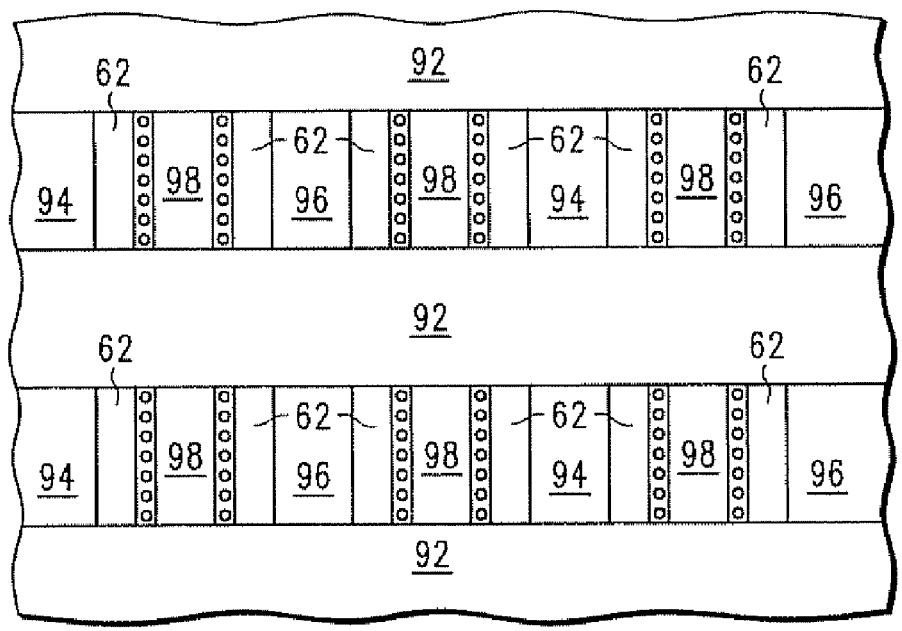
FIG. 9 includes an illustration of a top view of the workpiece of FIGS. 7 and 8 after selectively doping portions of the substrate within the fins and under bottoms of the trenches.
Figure 10:
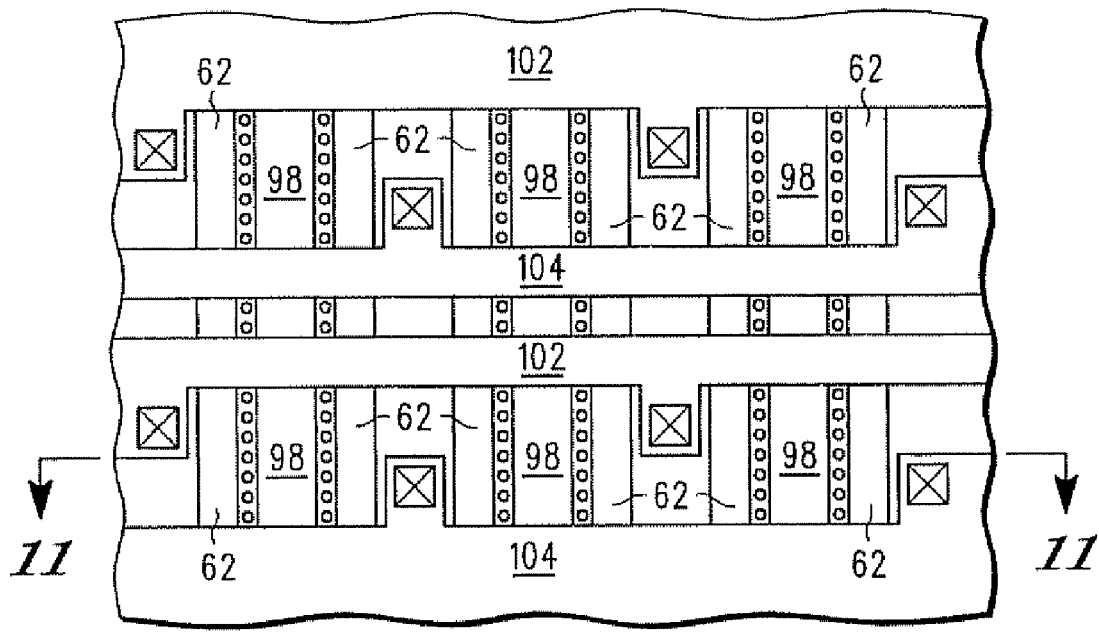
FIGS. 10 and 11 include illustrations of a top view and a cross-sectional view, respectively, of the workpiece of FIG. 9 after forming a substantially completed electronic device.
Figure 11:
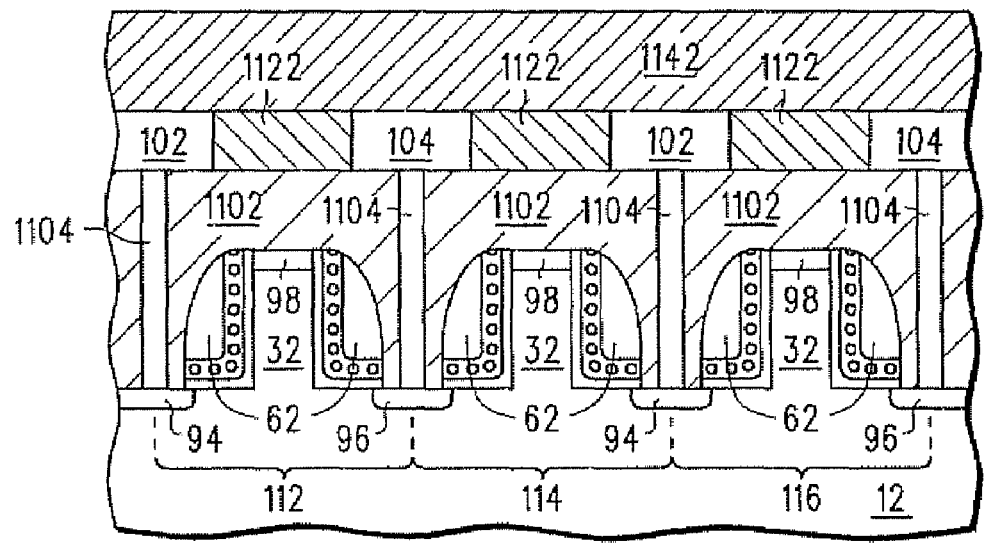

A variety of different layouts for the source/drain ("S/D") regions, bit lines, and word lines can be used. FIGS. 9 to 11 include a layout in which portions of the substrate 12 adjacent to the gate electrodes 62 and other portions of the substrate 12 adjacent to the gate electrodes 62 are doped, and bit lines are oriented substantially perpendicular to the gate lines. Referring to FIG. 9, a masking layer is formed over the array and includes masking members 92 and openings between the masking members 92. The masking members 92 are oriented substantially perpendicular to the gate electrodes 62. A dopant is introduced into portions of the substrate between the masking members 92 to form doped regions 94, 96, and 98. The doped regions 94 include portions of the substrate 12 within the fins 32, the doped regions 96 include portions of the substrate 12 below the bottoms of the trenches 22, and the doped regions 98 include portions of the fins 32. In one embodiment, the doped regions 94 and 96 can act as S/D regions. The dopant may be a p-type dopant (e.g., boron) or an n-type dopant (e.g., phosphorus or arsenic). In one embodiment, the dopant can be introduced using ion implantation. The masking members 92 are then removed by a conventional or proprietary technique. In one embodiment, the implanted dopant is activated by one or more subsequent thermal cycles, which may or may not serve a different primary purpose such as oxidation, deposition, annealing, drive or activation of a different implant dopant. In one embodiment, each of the doped regions 94, 96, and 98 has a dopant concentration of at least approximately $1E19$ atoms/cm$^3$. The formation of the masking members 92, their subsequent removal, and doping to form the doped regions 94, 96, and 98 are performed using conventional of proprietary techniques. In one embodiment, the NVM array 18 is now substantially complete other than formation of the electrical connections. Component fabrication within peripheral areas (not illustrated) of the electronic device can be performed using one or more conventional or proprietary techniques.

FIGS. 10 and 11 include illustrations of a top view and a cross-sectional view, respectively, of a substantially completed electronic device. FIG. 10 does not illustrate the insulating layers that are formed after forming the doped regions 94, 96, and 98 to simplify understanding of the positional relationships between the conductive members (e.g., gate electrodes, doped regions, conductive lines, etc.) of the electronic device. FIG. 10 includes conductive lines 102 and 104 that are oriented substantially perpendicular to the gate electrodes 62. In one embodiment, the conductive lines 102 and 104 are bit lines. The conductive lines 102 are electrically connected to the doped regions 94, and the conductive lines 104 are electrically connected to the doped regions 96. In a particular embodiment, the doped regions 98 within the fins 32 are allowed to electrically float.

FIG. 11 includes a cross-sectional view at sectioning line 11-11 in FIG. 10. The process is described with respect to FIG. 11. An interlevel dielectric layer 1102 is formed over the workpiece by a conventional or proprietary technique. The interlevel dielectric layer 1102 is patterned to form contact openings that extend to doped regions 94 and 96 and to other portions of NVM array 18 that are not illustrated in FIGS. 10 and 11. The interlevel dielectric layer 1102 can include an insulating material, such as an oxide, a nitride, an oxynitride, or any combination thereof. In a specific embodiment, an anisotropic etch can be used to form contact openings.

Conductive plugs 1104 and the conductive lines 102 and 104 are then formed. The conductive plugs 1104 and the conductive lines 102 and 104 can include the same or different conducting materials. Each of the conductive plugs 1104 and the conductive lines 102 and 104 can include doped silicon, tungsten, titanium, tantalum, titanium nitride, tantalum nitride, aluminum, copper, another suitable conductive material, or any combination thereof. In one particular embodiment, the conductive plugs 1104 include tungsten, and the conductive lines 102 and 104 include copper. An optional barrier layer, adhesion layer, or any combination thereof may be formed before the corresponding conductive layers (e.g., tungsten for the conductive plugs 1104 and copper for the conductive lines 102 and 104). An optional capping layer (e.g., a metal-containing nitride) may be used to encapsulate copper within the conductive lines 102 and 104.

In one embodiment, the conductive plugs 1104 are formed before the conductive lines 102 and 104. In one particular embodiment, a conductive layer (not illustrated) is formed over interlevel dielectric layer 1102 and substantially fills contact openings therein. Portions of the conductive layer that lie outside the contact openings are removed to form the conductive plugs 1104. In one embodiment, a conventional or proprietary chemical-mechanical polishing operation can be performed, and in another embodiment, a conventional or proprietary etching process can be performed.

Another insulating layer 1122 is then deposited and patterned to form trenches where the conductive lines 102 and 104 are formed. Interconnect trenches can be formed at locations within the NVM array 18, outside the NVM array 18, or any combination thereof. In one embodiment, another conductive layer is formed over the interlevel dielectric layer 1102 and substantially fills the interconnect trenches in the insulating layer 1122. Portions of the conductive layer that lie outside the interconnect trenches within the insulating layer 1122 are removed to form the conductive lines 102 and 104. In one embodiment, a conventional or proprietary chemical-mechanical polishing operation can be performed, and in another embodiment, a conventional or proprietary etching process can be performed. The insulating layer 1122 lies at substantially the same elevation as and between the conductive lines 102 and 104. In another embodiment (not illustrated), the conductive plugs 1102 and the conductive lines 102 and 104 are formed concurrently using a conventional or proprietary dual-inlaid process.

In another embodiment (not illustrated), additional insulating and conductive layers can be formed and patterned to form one or more additional levels of interconnects. After the last interconnect level has been formed, an encapsulating layer 1142 is formed over substrate 12, including the NVM array 18 and peripheral areas. The encapsulating layer 1142 can include one or more insulating film, such as an oxide, a nitride, an oxynitride, or a combination thereof.

Figure 12:
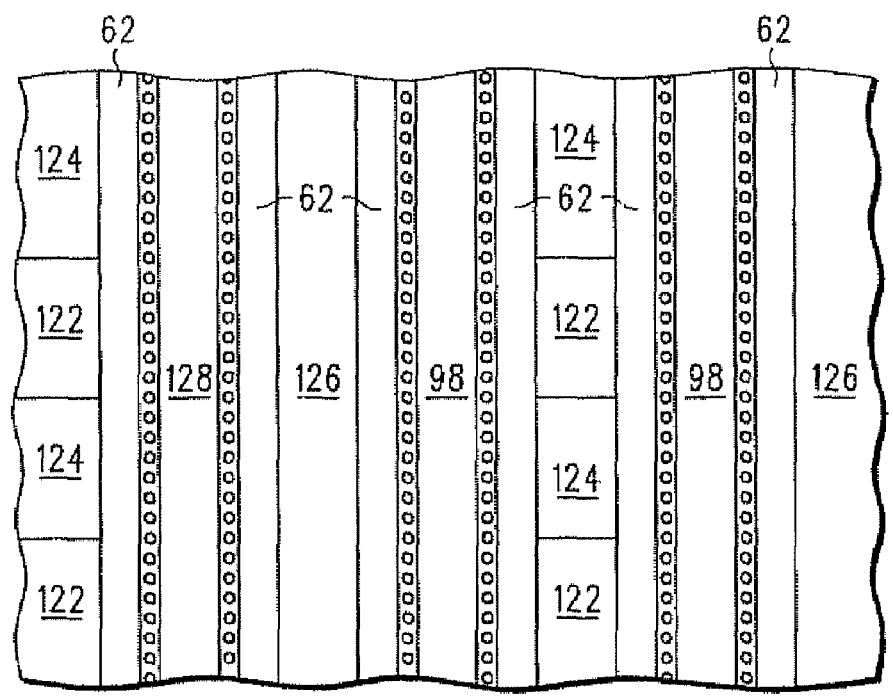
FIG. 12 includes an illustration of a top view of the workpiece of FIGS. 7 and 8 after selectively doping portions of the substrate within the fins and under bottoms of the trenches.
Figure 13:
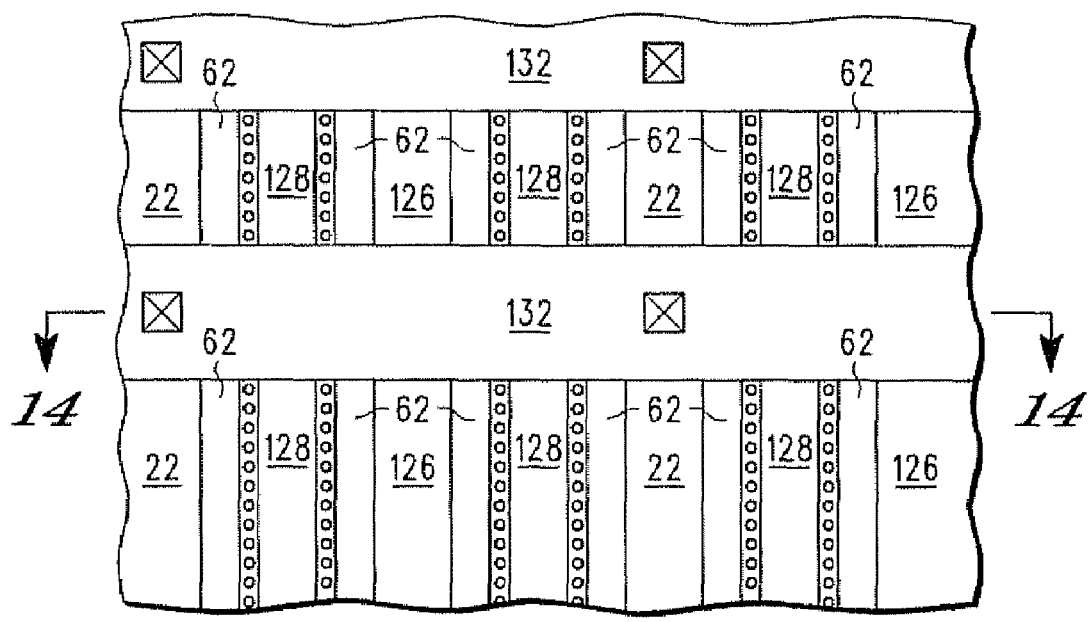
FIGS. 13 and 14 include illustrations of a top view and a cross-sectional view, respectively, of the workpiece of FIG. 12 after forming a substantially completed electronic device.
Figure 14:
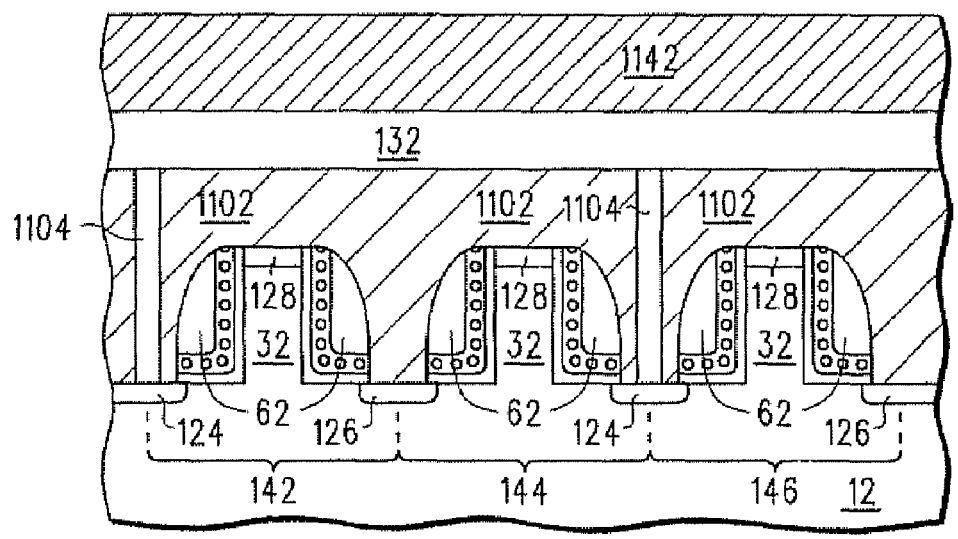

FIGS. 12 to 14 illustrate another embodiment having a different layout for the source/drain ("S/D") regions and bit lines. FIGS. 12 to 14 include a layout in which portions of the substrate 12 adjacent to the gate electrodes 92 and other portions of the substrate 12 adjacent to the gate electrodes are doped, and other bit lines are oriented substantially parallel to the gate electrodes 62. In this embodiment, the process through formation of the insulating layers 82 and 84 (FIG. 8) can be performed using any embodiment as previously described with respect to FIGS. 1 to 8.

Referring to FIG. 12, a masking layer is formed over the array and includes masking members 122 and openings between the masking members 122. As illustrated, the masking members 122 cover portions of the bottoms of every other trench 22, and in another embodiment, the masking members 122 can cover portions of the gate electrodes 62, the fins 32, or any combination thereof. A dopant is introduced into portions of the substrate that are not covered the masking members 122 to form doped regions 124, 126, and 128. The doped regions 124 include portions of the substrate 12 within every other trench 22, the doped regions 126 include portions of the substrate 12 below the bottoms of the remaining trenches 22, and the doped regions 128 include portions of the fins 32. In one embodiment, the doped regions 124 and 126 can act as S/D regions. In the illustrated embodiment, the doped region 126 is oriented substantially parallel to the gate electrodes 62 and acts as a bit line. The dopant may be a p-type dopant (e.g., boron) or an n-type dopant (e.g., phosphorus or arsenic). In one embodiment, the dopant can be introduced using ion implantation. The masking members 122 are then removed by a conventional or proprietary technique. In one embodiment, the implanted dopant is activated by one or more subsequent thermal cycles, which may or may not serve a different primary purpose such as oxidation, deposition, annealing, drive or activation of a different implant dopant. In one embodiment, each of doped regions 124, 126, and 128 has a dopant concentration of at least approximately 1E19 atoms/cm$^3$. The formation of the masking members 122, their subsequent removal, and doping to form the doped regions 124, 126, and 128 are performed using conventional or proprietary techniques. In one embodiment, the NVM array 18 is now substantially complete other than formation of the electrical connections. Component fabrication within peripheral areas (not illustrated) of the electronic device can be performed using one or more conventional or proprietary techniques.

FIGS. 13 and 14 include illustrations of a top view and a cross-sectional view, respectively, of a substantially completed electronic device. FIG. 13 does not illustrate the insulating layers after forming the doped regions 124 and 126 to simplify understanding of the positional relationships between the conductive members (e.g., gate electrodes, doped regions, conductive lines, etc.) of the electronic device. FIG. 13 includes conductive lines 132 that are oriented substantially perpendicular to the doped region 126 and the gate electrodes 62. In one embodiment, the conductive lines 132 are bit lines. The conductive lines 132 are electrically connected to the doped regions 124. Portions of the fins 32 that were not doped when forming the doped regions 124 are illustrated as fins 32 in FIG. 13. In a particular embodiment, the doped regions 128 within the fins 32 are allowed to electrically float.

FIG. 14 includes a cross-sectional view at sectioning line 14-14 in FIG. 13. The process is described with respect to FIG. 14. The process of forming the interlevel dielectric layer 1102, conductive plugs 1104, and insulating layer 1122 (not illustrated) are formed using any of the embodiments described with respect to FIGS. 10 and 11. The insulating layer 1122 is patterned to form the interconnect trenches. Referring to FIG. 13, the remaining portions (not illustrated) of the insulating layer 1122 lie between the conductive lines 132, and the interconnect trenches lie where the conductive lines 132 are to be formed.

The conductive lines 132 are then formed. The conductive lines 132 can include any of the materials as previously described with respect to the conductive plugs 1104 and the conductive lines 102 and 104. More particularly, after the insulating layer 1122 is deposited and patterned to form the interconnect trenches, a conductive layer is formed over the interlevel dielectric layer 1102 and substantially fills the interconnect trenches in the insulating layer 1122. Portions of the conductive layer that lie outside the interconnect trenches within the insulating layer 1122 are removed to form the conductive lines 132. In one embodiment, a conventional or proprietary chemical-mechanical polishing operation can be performed, and in another embodiment, a conventional or proprietary etching process can be performed. The insulating layer 1122 lies at substantially the same elevation as and between the conductive lines 132. In another embodiment (not illustrated), the conductive plugs 1102 and the conductive lines 132 are formed concurrently using a conventional or proprietary dual-inlaid process.

In another embodiment (not illustrated), additional insulating and conductive layers can be formed and patterned to form one or more additional levels of interconnects. After the last interconnect level has been formed, the encapsulating layer 1142 is formed over substrate 12, including the NVM array 18 and peripheral areas. The NVM array 18 includes memory cells 142, 144, 146, and 148.

Another layout can be used in another embodiment (not illustrated). The masking, doping, and bit line orientations described with respect to FIGS. 12 to 14 can be reversed. The doped regions 124 can be continuous along the trenches, and the doped regions 126 can be segmented. The conductive lines 132 would be electrically connected to the doped regions 126, rather than the doped regions 124.

Still other layouts can be used but are not illustrated. For example, buried bit lines can be used. Doped regions within the substrate 12 can extend along the length of the trenches. Spaced-apart field isolation regions can be formed along the bottoms of every trench 22 or every other trench 22 before forming the gate electrodes 62. When forming the doped regions for the S/D regions, as previously described, the spaced-apart field isolation regions help to form a plurality of spaced-apart doped regions along the bottoms of those trenches that include the spaced-apart field isolation regions. Appropriate bit line contacts can then be made to those spaced-apart doped regions. In yet another embodiment, the gate electrodes 62 can be formed using any of the embodiments as described with respect to FIGS. 7 and 8. Depending on the particular layout is chosen, one or both of the gate electrodes 62 within each trench 22 can be segmented, such that each of the affected gate electrodes 62 include a plurality of gate electrodes that are electrically connected to word lines that are oriented substantially perpendicular to the trenches 22. In this particular embodiment, doped regions for the S/D regions can be formed along substantially the entire lengths of the trenches. Field isolation regions, as described in a prior embodiment, are not required for this embodiment.

In another example (not illustrated), buried bit lines can be formed within the substrate 12, underlie the trenches 22 and be spaced apart from the bottoms 34 of the trenches 22. The buried bit lines would be oriented substantially perpendicular to the trenches 22, similar to the orientation of the conductive lines 132 in FIG. 13. After forming the buried bit lines, a semiconductor layer can be epitaxial grown over the buried bit lines and have a thickness that is greater than the depth of the trenches. The semiconductor layer can be formed using a conventional or proprietary technique. Trenches are formed using an embodiment previously described. The bottoms 34 of the trenches 22 are spaced apart from the buried bit lines by portions of the semiconductor layer. After forming the trenches 22 and the gate electrodes 62, a masking layer is formed with masking members within the then be formed within the trenches 22. The pattern would be similar to the masking layer described with respect to FIG. 12, except that the masking members would lie within the trenches 22 and would not overlie the fins 32. Doping would be performed similar to forming the doped regions 124, 126, and 128 in FIG. 12. Another mask can be formed with doped regions 124 exposed, while doped regions 126 and 128 remained covered. A link region, such as another doped region, can be formed that electrically connects the doped regions 124 to the underlying buried bit lines. Because the doped regions 126 are covered, the link regions are not formed under the doped regions 126, and therefore, the doped regions 126 are not electrically connected to the buried bit lines. In this particular embodiment, a contactless array can be formed. After reading this specification, skilled artisans will appreciate that still other layouts can be used.

The NVM array 18 can include memory cells using any of the layouts as previously described. Circuit schematics and cross references to physical embodiments are described to illustrate better how memory cells within NVM array 18 can be electrically configured and used.

Figure 15:
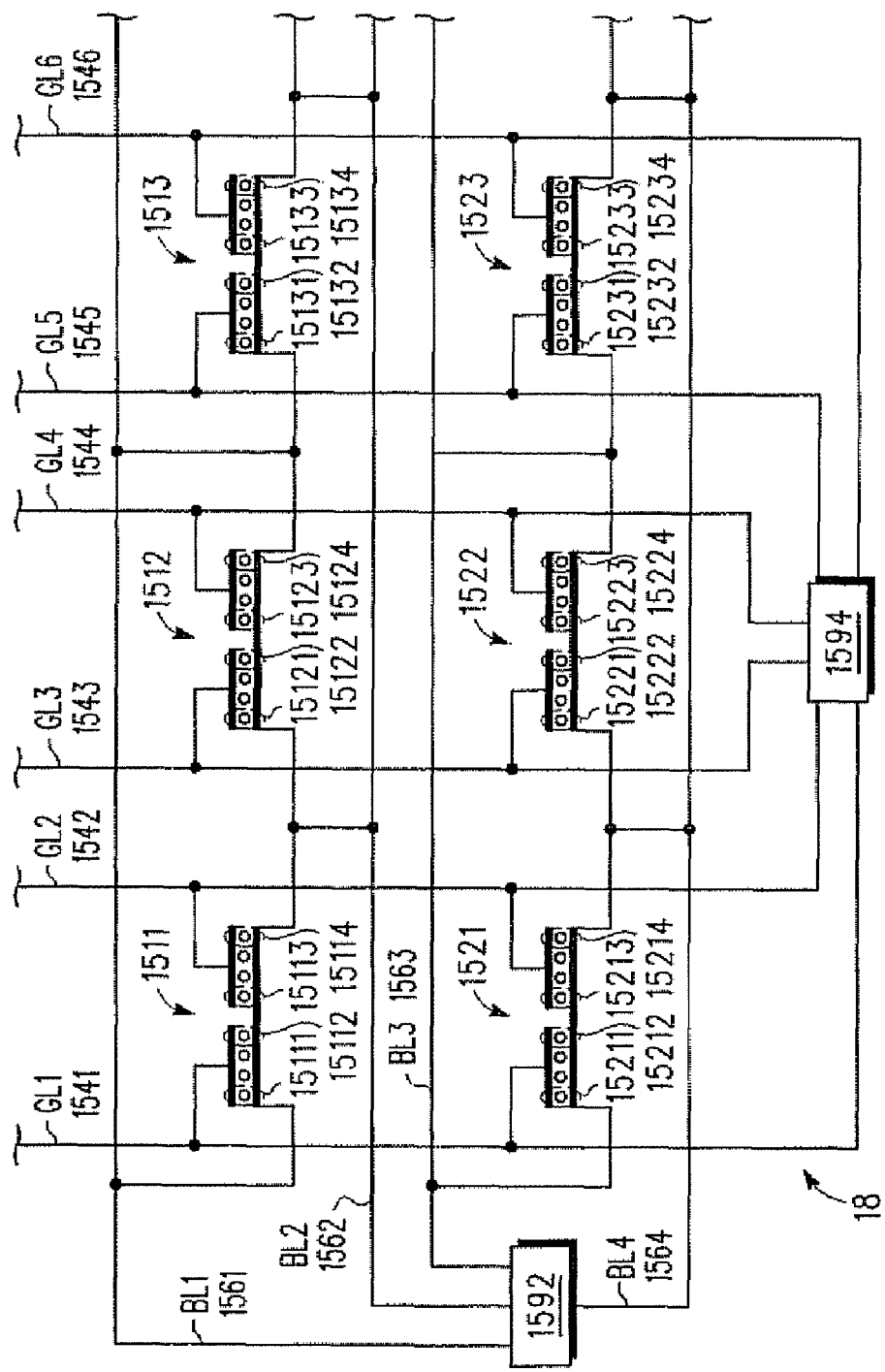
Figure 16:
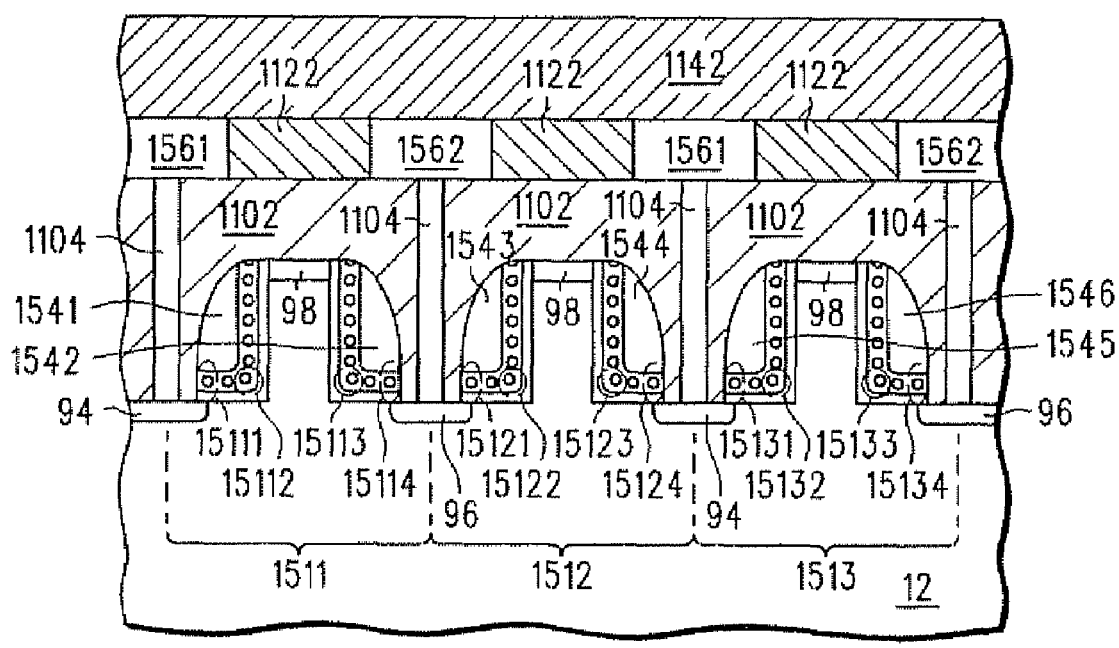

FIG. 15 includes a circuit schematic for an embodiment as described with respect to the embodiment as illustrated in FIG. 16. Memory cells 1511, 1512, 1513, 1521, 1522, and 1523 are oriented within the NVM array 18, as illustrated in FIG. 15.

Referring to FIG. 15, BL1 1561 is electrically connected to S/D regions of the memory cells 1511, 1512, and 1513, and BL2 1562 is electrically connected to the other S/D region of the memory cells 1511, 1512, and 1513. BL3 1563 is electrically connected to S/D regions of the memory cells 1521, 1522, and 1523, and BL4 1564 is electrically connected to the other S/D region of the memory cells 1521, 1522, and 1523.

GL1 1541 is electrically connected to gate electrodes of the memory cell 1511 and 1521, and GL2 1542 is electrically connected to other gate electrodes of the memory cell 1511 and 1521. GL3 1543 is electrically connected to gate electrodes of the memory cell 1512 and 1522, and GL4 1544 is electrically connected to other gate electrodes of the memory cell 1512 and 1522. GL5 1545 is electrically connected to gate electrodes of the memory cell 1513 and 1523, and GL6 1546 is electrically connected to other gate electrodes of the memory cells 1513 and 1523. Each of the gate electrodes can act as a select gate electrode or a control gate electrode, depending on biasing conditions.

A bit line control module 1592 is coupled to BL1 1561, BL2 1562, and BL3 1563, and BL4, 1564. A gate line control module 1594 is coupled to GL1 1541, GL2 1542, GL3 1563, GL4 1544, GL5 1545, and GL6 1546. Each of the bit line control module 1592 and the gate line control module 1594 are conventional and may include row or column decoders, voltage drivers, other suitable circuits to operate the NVM array 18, or any combination thereof. Each of the bit line control module 1592 and the gate line control module 1594 can include more than one control module. Each of the bit line control module 1592 and the gate line control module 1594 can be biased or electrically float to achieve the proper operation of the NVM array 18.

FIG. 16 illustrates a physical embodiment of a portion of the NVM array 18 corresponding to the row that includes the memory cells 1511, 1512, and 1513. FIG. 16 is substantially the same as FIG. 11 except that reference numbers as used in the circuit schematics are used in FIG. 16.

Charge storage regions for the memory cells 1511, 1512, and 1513 are illustrated in FIGS. 15 and 16. The memory cell 1511 includes charge storage regions 15111, 15112, 15113, and 15114. The memory cell 1512 includes charge storage regions 15121 15122, 15123, and 15124. The memory cell 1513 includes charge storage regions includes charge storage regions 15131 15132, 15133, and 15134. The memory cells 1521 to 1523 include similar charge storage regions to the memory cells 1511 to 1513, respectively, but are not illustrated in FIG. 16.

FIG. 17 includes a table that has some of the operating voltages for memory cells along the top row of memory cells, as illustrated in FIG. 15. When programming charge storage region 15111 in accordance with one embodiment, BL1 1561 and BL2 1562 are biased to allow electrons to flow from BL2 1561 to BL1 1561. Each of GL1 1541 and GL2 1542 is biased to allow carriers to flow through the channel region of memory cell 1511. All other gate lines (e.g., GL3 1543, GL4 1544, etc.) are at approximately 0 volts, and BL3 1563 and BL4 1564 are allowed to electrically float. In another embodiment, BL3 1563 and BL4 1564 can be at substantially 0 volts. Referring to FIG. 16, the channel region of the memory cell 1511 allows electrons to flow between BL2 1562 and BL1 1561. The channel region of the memory cell 1511 is adjacent to GL1 1541, GL2 1542, one of the fins 32 and between the doped regions 94 and 96 that are electrically connected to BL1 1561 and BL2 1562, respectively. More particularly, GL1 1541 and GL2 1542 are biased to allow electrons to flow from BL2 1564 from the doped region 96 to the doped region 94. The electrical field generated in the channel region of the memory cell 1511 near the doped region 94 (via BL1 1561) and GL1 1541 is sufficient to generate hot carriers within the channel region of memory cell 1511 near doped region 94. At least some of the hot carriers are attracted to the discontinuous storage elements at the charge storage region 15111 near the junction formed near the doped region 94 within the substrate 12. The programming mechanism for programming the charge storage region 15111 is HCI.

The charge storage region 15112 within the memory cell 1511 is not programmed because GL1 1541 and GL2 1542 are at substantially similar voltages. Memory cells 1512, 1513, 1514, and 1521 to 1524 are not programmed because the voltages on the other gate lines are at substantially zero volts, and because BL3 1563 and BL4 1564 are electrically float or are at substantially the same voltage so that no current flows between those bit lines.

On a relative basis and when the substrate 12 (or associated well region therein) is biased to zero volts, when programming charge storage region 15111, the voltage differences between GL1 1541 and BL2 1562 and between GL2 1542 and BL2 1562 are in a range of approximately one to two times higher than the voltage difference between BL1 1561 and BL2 1562. In a particular embodiment, the voltage differences between GL1 1541 and BL2 1562 and between GL2 1542 and BL2 1562 are no greater than approximately 1.6 times the voltage difference between BL1 1561 and BL2 1562.

Charge storage region 15112 can be programmed using the voltages as listed in FIG. 17. As compared to charge storage region 15111, the voltage on GL2 1542 is reduced. The voltages allow a higher electrical field to be formed in the channel region at a location under GL1 1542 at a location along the bottom of the trench but further from the doped region 94, as compared to the charge storage region 15111. The relatively higher voltage on GL1 1542 as compared to GL2 1544 allows hot carriers to be more strongly attracted to discontinuous storage elements at charge storage region 15112. The programming mechanism for programming charge storage region 15112 is SSI.

On a relative basis and when the substrate 12 (or associated well region therein) is biased to zero volts, when programming charge storage region 15112, the voltage differences between GL1 1541 and BL2 1562 and between GL2 1542 and BL2 1562 are in a range of approximately one to two times higher than the voltage difference between BL1 1561 and BL2 1562. GL1 1541 is at a higher potential as compared to GL2 1542. In a particular embodiment, the voltage difference between GL1 1541 and BL2 1562 is greater than approximately 1.5 times the voltage on BL2 1562, and the voltage difference between GL2 1542 and BL2 1562 is less than approximately 1.5 times the voltage difference between BL1 1561 and BL2 1562.

Regarding the other charge storage regions and memory cells, charge storage regions 15113, 15122, 15123, 15132, and 15333 for memory cells 1511 to 1513 are programmed using SSI. All other charge storage regions within memory cells 1511 to 1514 that have not been described are programmed using HCI. All other charge storage regions for memory cells 1521 to 1524 are similar to memory cells 1511 to 1514, respectively. Each memory cell that includes two gate electrodes can store up to four bits of data, and each memory cell that includes one gate electrode can store up to two bits of data.

In another embodiment, not illustrated, the charge storage region 15111 can be programmed using Fowler-Nordheim tunneling. Programming the charge storage region 15111 can be accomplished by creating a potential difference in a range of about 12 to 16 volts between BL1 1561 and GL1 1541. In one embodiment, erasing can be performed by biasing BL1 1561 to approximately +7 volts, setting the GL1 1541 to approximately −7 volts, and allowing the bit lines to electrically float. Note that the voltages used for BL1 1561 and GL1 1541 do not need to be symmetric with respect to 0 volts. For example, a combination of +5 volts and −9 volts can be used. After reading this specification, skilled artisans will be able to determine a set of voltages to be used for Fowler-Nordheim tunneling that meets their needs or desires.

Erasing of NVM array 18 can be accomplished by creating a potential difference in a range of about 12 to 16 volts between substrate 12 (or well region therein) and the gate electrodes of the memory cells. In one embodiment, erasing can be performed by biasing substrate 12 (or associated well region therein) to approximately −7 volts, setting the gate lines to approximately +7 volts, and allowing the bit lines to electrically float. Note that the voltages used for substrate 12 and the gate lines do not need to be symmetric with respect to 0 volts. For example, a combination of −5 volts and +9 volts can be used. After reading this specification, skilled artisans will be able to determine a set of voltages to be used for erasing that meets their needs or desires.

The reading of data within NVM array 18 for memory cells 1511 to 1513 and 1521 to 1523 is given in FIG. 17. When reading datum at charge storage region 15111 of memory cell 1511, BL1 1561 and BL2 1562 are biased so that electrons flow from BL2 1562 to BL1 1561. GL2 1542 is biased so that a portion of the channel regions lying adjacent to GL2 1542 allows carriers to flow regardless of the programming state at charge storage regions 15113 and 15114 within memory cell 1511. GL1 1541 is biased to a potential between the programmed and erased threshold voltages. In one particular embodiment, the voltage difference between GL1 1541 and BL2 1562 is approximately 0.35 to 0.65 times the voltage difference between GL2 1541 and BL2 1562. A sense amplifier (not illustrated) coupled to the BL1 1561 or BL2 1562 will detect a higher level of current when the charge storage region 15111 is not programmed compared to when the charge storage region 15111 is programmed.

As compared to reading datum at charge storage region 15111, when reading datum at charge storage region 15112, the voltages on BL1 1562 and BL2 1564 are increased. In a particular embodiment, the voltages on BL1 1561 and BL2 1562 are increased by approximately 1 volt. All other voltages can be kept substantially the same, as compared to when reading charge storage region 15111. In one particular embodiment, the voltage difference between GL1 1541 and BL2 1562 is approximately 0.24 to 0.5 times the voltage difference between GL2 1541 and BL2 1562. A sense amplifier (not illustrated) coupled to the BL1 1561 or BL2 1562 will detect a higher level of current when the charge storage region 15112 is not programmed compared to when the charge storage region 15112 is programmed.

When reading datum at charge storage region 15113, the voltages can be substantially the same as used to read charge storage region 15112 except that the voltages on BL1 1561 and BL2 1562 are reversed, and the voltages on GL1 1541 and GL2 1542 are reversed. The reading of data at other charge storage regions with memory cells 1511 to 1514, 1521 to 1524 can be performed in a similar manner.

The processes and structures described allow memory cells or portions thereof to be formed with gate electrodes and doped regions adjacent to the gate electrodes that have dimensions smaller than the resolution limits of lithographic processes. More specifically, the gate electrodes 62 are in the form of spacers, and the doped regions 94 and 96 (FIG. 11) or the doped regions 124 and 126 (FIG. 14) are adjacent to the gate electrodes 62. Within each memory cell, a fin 32 is formed that allows a portion of the substrate 12 under the fin 32 to act as a resistor within the channel region to assist in generating a proper electrical field for SSI. HCI and SSI can be used to program charge storage regions within the memory cells. Other embodiments allow for an electronic device having a contactless array.

Many different aspects and embodiments are possible. Some of those aspects and embodiments are described below. After reading this specification, skilled artisans will appreciate that those aspects and embodiments are only illustrative and do not limit the scope of the present invention.

An electronic device can include a substrate including a fin lying between a first trench and a second trench, wherein the fin is no more than approximately 90 nm wide. The electronic device can also include a first gate electrode within the first trench and adjacent to the fin, and a second gate electrode within the second trench and adjacent to the fin. The electronic device can further include discontinuous storage elements including a first set of discontinuous storage elements and a second set of discontinuous storage elements, wherein the first set of the discontinuous storage elements lies between the first gate electrode and the fin, and the second set of the discontinuous storage elements lies between the second gate electrode and the fin.

In one embodiment of the first aspect, the substrate has a primary surface, the first gate electrode has a first upper surface that lies at a first elevation not significantly higher than the primary surface of the substrate, and the second gate electrode has a second upper surface that lies at a second elevation not significantly higher than the primary surface of the substrate. In another embodiment, each of the first gate electrode and the second gate electrode includes a control/select gate electrode. In still another embodiment, substantially all discontinuous storage elements lie within the trenches, including the first trench and the second trench, within the substrate. In a yet another embodiment, the first set of the discontinuous storage elements also underlies a first base of the first gate electrode, and the second set of the discontinuous storage elements also underlies a second base of the second gate electrode. In a further embodiment, the fin has a width in a range of approximately 10 nm to approximately 50 nm.

In another further embodiment of the first aspect, the electronic device further includes a third gate electrode overlying the fin. In a particular embodiment, the electronic device further includes a first source/drain region lying below the first trench, a second source/drain region lying below the second trench, a third source/drain region lying within the fin and adjacent to a first side of the third gate electrode, and a fourth source/drain region lying within the fin and adjacent to a second side of the third gate electrode opposite the first side. In a more particular embodiment, the first gate electrode, the second gate electrode, the first source/drain region, and the second source/drain region are parts of a first memory cell, and the third gate electrode, the third source/drain region, and the fourth source/drain region are parts of a second memory cell. In an even more particular embodiment, the electronic device further includes a first bit line coupled to the first source/drain region, a second bit line coupled to the second source/drain region, a third bit line coupled to the third source/drain region, and a fourth bit line coupled to the fourth source/drain region. In this embodiment, the electronic device includes a memory array of memory cells, including the first memory cell and the second memory cell, the first bit line and the second bit line are oriented substantially perpendicular to the third bit line and the fourth bit line, and the first gate electrode and the second gate electrode are oriented substantially perpendicular to the third gate electrode.

In a second aspect, a process of forming an electronic device can include forming a first trench and a second trench within a substrate, wherein a portion of the substrate lies between the first trench and the second trench, and has a width of no more than approximately 90 nm. The process can also include forming discontinuous storage elements within the first trench and the second trench, and forming a first gate electrode within the first trench and a second gate electrode within the second trench. The process can further include removing a portion of the discontinuous storage elements to form a first set of discontinuous storage elements and a second set of discontinuous storage elements, wherein the first set of the discontinuous storage elements lies between the first gate electrode and the portion of the substrate, and the second set of the discontinuous storage elements lies between the second gate electrode and the portion of the substrate.

In one embodiment of the second aspect, forming the first gate electrode and forming the second gate electrode includes depositing a gate electrode material over the portion of the substrate and along walls and bottoms of the first trench and the second trench, and anisotropically etching the gate electrode material to remove a portion of the gate electrode material from over the portion of the substrate. In another embodiment, forming the discontinuous storage elements is part of forming a charge storage stack, and forming the first gate electrode and forming the second gate electrode includes exposing a portion of the charge storage stack. In a particular embodiment, removing the portion of the discontinuous charge storage elements includes etching the portion of the charge storage stack. In another particular embodiment, removing the portion of the discontinuous charge storage elements includes converting the portion of the discontinuous charge storage elements to an electrically insulating material.

In a further embodiment of the second aspect, the process further includes doping a first portion of the substrate along a first bottom of the first trench and doping a second portion of the substrate along a second bottom of the second trench. In a particular embodiment, the process further includes forming a third gate electrode over the fin, wherein the third gate electrode is oriented substantially perpendicular the first gate electrode and the second gate electrode.

In a third aspect, a process of using an electronic device can include providing a memory cell. The memory cell can include a substrate, wherein a first trench and a second trench extend therein and are spaced apart from each other by a portion of the substrate. The memory cell can also include a first gate electrode within the first trench, and a first source/drain region lying along a first bottom of the first trench, wherein the first source/drain region is coupled to a first bit line. The memory cell can also include a second gate electrode within the second trench, and a second source/drain region lying along a second bottom of the second trench, wherein the first source/drain region is coupled to a second bit line. The memory cell can further include discontinuous storage elements including a first set of discontinuous storage elements and a second set of discontinuous storage elements, wherein the first set of the discontinuous storage elements lies between the first gate electrode and a first bottom of the first trench, and the second set of the discontinuous storage elements lies between the second gate electrode and a second bottom of the second trench. The process can also include programming a first bit of the memory cell including biasing the first bit line and the second bit line at a first voltage difference, biasing the first gate electrode, such that a second voltage difference between the first gate electrode and the first bit line is no greater than approximately half of the first voltage difference, and biasing the second gate electrode, such that a third voltage difference between the second gate electrode and the first bit line is in a range of approximately 0.5 to approximately 1.5 times the first voltage difference, wherein a substantial fraction of current flows underneath the portion of the substrate during programming the first bit.

In one embodiment of the third aspect, the process further includes programming a second bit of the memory cell including biasing the first bit line and the second bit line at a fourth voltage difference, biasing the first gate electrode, such that a fifth voltage difference between the first gate electrode and the second bit line is in a range of approximately 0.5 to approximately 1.5 times the first voltage difference, and biasing the second gate electrode, such that a sixth voltage difference between the second gate electrode and the second bit line is in a range of approximately 0.5 to approximately 1.5 times the first voltage difference. In another embodiment, the process further includes erasing the memory cell including biasing the substrate and the second gate electrode at a fourth voltage difference, such that the fourth voltage difference has an opposite polarity compared to first voltage difference, and the fourth voltage difference has a magnitude that is at least approximately 4 times a magnitude of the first voltage difference, and electrically floating the first bit line and the second bit line.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device comprising:
   forming a first trench and a second trench within a substrate, wherein a portion of the substrate lies between the first trench and the second trench, and has a width of no more than approximately 90 nm;
   forming discontinuous storage elements within the first trench and the second trench;
   forming a first gate electrode within the first trench and a second gate electrode within the second trench;
   removing a portion of the discontinuous storage elements to form a first set of discontinuous storage elements and a second set of discontinuous storage elements, wherein the first set of the discontinuous storage elements lies between the first gate electrode and the portion of the substrate, and the second set of the discontinuous storage elements lies between the second gate electrode and the portion of the substrate; and
   forming a doped region within an uppermost part of the portion of the substrate that lies between the first and second trenches, wherein in a finished device, the doped region electrically floats.

2. The process of claim 1, wherein forming the first gate electrode and forming the second gate electrode comprises:
   depositing a gate electrode material over the portion of the substrate and along walls and bottoms of the first trench and the second trench; and
   anisotropically etching the gate electrode material to remove a portion of the gate electrode material from over the portion of the substrate.

3. The process of claim 1, wherein:
   forming the discontinuous storage elements is part of forming a charge storage stack; and
   forming the first gate electrode and forming the second gate electrode comprises exposing a portion of the charge storage stack.

4. The process of claim 3, wherein removing the portion of the discontinuous charge storage elements comprises etching the portion of the charge storage stack.

5. The process of claim 3, wherein removing the portion of the discontinuous charge storage elements comprises converting the portion of the discontinuous charge storage elements to an electrically insulating material.

6. The process of claim 1, further comprising doping a first portion of the substrate along a first bottom of the first trench and doping a second portion of the substrate along a second bottom of the second trench.

7. A process of forming an electronic device comprising:
   forming a first trench and a second trench within a substrate, wherein a portion of the substrate lies between the first trench and the second trench, and has a width of no more than approximately 90 nm;
   forming discontinuous storage elements within the first trench and the second trench;

forming a first gate electrode within the first trench and a second gate electrode within the second trench;

removing a portion of the discontinuous storage elements to form a first set of discontinuous storage elements and a second set of discontinuous storage elements, wherein the first set of the discontinuous storage elements lies between the first gate electrode and the portion of the substrate, and the second set of the discontinuous storage elements lies between the second gate electrode and the portion of the substrate;

doping a first portion of the substrate along a first bottom of the first trench and doping a second portion of the substrate along a second bottom of the second trench; and forming a third gate electrode over the fin, wherein the third gate electrode is oriented substantially perpendicular the first gate electrode and the second gate electrode.

8. A process of using an electronic device comprising:
providing a memory cell including:
 a substrate, wherein a first trench and a second trench extend therein and are spaced apart from each other by a portion of the substrate;
 a first gate electrode within the first trench;
 a first source/drain region lying along a first bottom of the first trench, wherein the first source/drain region is coupled to a first bit line;
 a second gate electrode within the second trench;
 a second source/drain region lying along a second bottom of the second trench, wherein the first source/drain region is coupled to a second bit line; and
 discontinuous storage elements including a first set of discontinuous storage elements and a second set of discontinuous storage elements, wherein the first set of the discontinuous storage elements lies between the first gate electrode and a first bottom of the first trench, and the second set of the discontinuous storage elements lies between the second gate electrode and a second bottom of the second trench; and
programming a first bit of the memory cell comprising:
 biasing the first bit line and the second bit line at a first voltage difference;
 biasing the first gate electrode, such that a second voltage difference between the first gate electrode and the first bit line is no greater than approximately half of the first voltage difference; and
 biasing the second gate electrode, such that a third voltage difference between the second gate electrode and the first bit line is in a range of approximately 0.5 to approximately 1.5 times the first voltage difference, wherein a substantial fraction of current flows underneath the portion of the substrate during programming the first bit.

9. The process of claim 8, further comprising programming a second bit of the memory cell comprising:
 biasing the first bit line and the second bit line at a fourth voltage difference;
 biasing the first gate electrode, such that a fifth voltage difference between the first gate electrode and the second bit line is in a range of approximately 0.5 to approximately 1.5 times the first voltage difference; and
 biasing the second gate electrode, such that a sixth voltage difference between the second gate electrode and the second bit line is in a range of approximately 0.5 to approximately 1.5 times the first voltage difference.

10. The process of claim 8, further comprising erasing the memory cell comprising:
 biasing the substrate and the second gate electrode at a fourth voltage difference, such that the fourth voltage difference has an opposite polarity compared to first voltage difference, and the fourth voltage difference has a magnitude that is at least approximately 4 times a magnitude of the first voltage difference; and
 electrically floating the first bit line and the second bit line.

11. The process of claim 8, wherein providing the memory cell comprises providing the memory cell further comprising a fin lying between the first and second trenches.

12. The process of claim 11, wherein providing the memory cell comprises providing the memory cell further comprising a doped region lying along an uppermost surface of a fin, wherein the doped region is spaced apart from the first and second source/drain regions.

13. The process of claim 12, wherein providing the doped region has a dopant concentration of at least approximately 1E19 atoms/cm$^3$.

14. The process of claim 12, wherein programming the first bit of the memory cell is performed while the doped region electrically floats.

15. The process of claim 2, wherein forming the first gate electrode and forming the second gate electrode is performed such that:
 the first gate electrode has a first upper surface that lies at a first elevation not significantly higher than a primary surface of the substrate; and
 the second gate electrode has a second upper surface that lies at a second elevation not significantly higher than the primary surface of the substrate.

16. The process of claim 2, wherein forming the first gate electrode and forming the second gate electrode is performed such that each of the first gate electrode and the second gate electrode includes a control/select gate electrode.

17. The process of claim 1, wherein removing the portion of the discontinuous storage elements is performed such That substantially all discontinuous storage elements lie within trenches, including the first trench and the second trench, within the substrate.

18. The process of claim 2, wherein:
 forming the first and second trenches within the substrate is performed such that the portion of the substrate lying between the first and second trenches includes a fin; and
 removing the portion of the discontinuous storage elements is performed such that a first set of the discontinuous storage elements lies between the first gate electrode and the fin, a second set of the discontinuous storage elements lies between the second gate electrode and the fin, and substantially no discontinue storage elements overlie the fin.

19. The process of claim 18, wherein removing the portion of the discontinuous storage elements is performed such that:
 the first set of the discontinuous storage elements also underlies a first base of the first gate electrode; and
 the second set of the discontinuous storage elements also underlies a second base of the second gate electrode.

20. The process of claim 1, wherein the portion of the substrate lying between the first trench and the second trench includes a fin having a width in a range of approximately 10 nm to approximately 50 nm.

* * * * *